United States Patent [19]
Rai-Choudhury

[11] 3,914,138
[45] Oct. 21, 1975

[54] METHOD OF MAKING SEMICONDUCTOR DEVICES BY SINGLE STEP DIFFUSION

[75] Inventor: Prosenjit Rai-Choudhury, Murrysville, Pa.

[73] Assignee: Westinghouse Electric Corporation, Pittsburgh, Pa.

[22] Filed: Aug. 16, 1974

[21] Appl. No.: 498,016

[52] U.S. Cl. ................ 148/186; 148/187; 148/188; 148/190; 148/1.5
[51] Int. Cl.$^2$ ............................................ H01L 7/34
[58] Field of Search ............ 148/188, 190, 186, 1.5

[56] References Cited

UNITED STATES PATENTS

| | | | |
|---|---|---|---|
| 3,346,428 | 10/1967 | Teramoto et al. | 148/188 |
| 3,362,858 | 1/1968 | Knopp | 148/177 |
| 3,445,302 | 5/1969 | Lepiane | 148/186 |
| 3,560,279 | 2/1971 | Havos | 148/188 |
| 3,577,287 | 5/1971 | Norwich et al. | 148/189 |
| 3,615,873 | 10/1971 | Sluss et al. | 148/1.5 |
| 3,615,945 | 10/1971 | Yokozawa | 148/190 |
| 3,630,793 | 12/1971 | Christensen et al. | 148/188 |
| 3,798,079 | 3/1974 | Chu et al. | 148/33.5 |
| 3,829,335 | 8/1974 | Allison et al. | 148/189 |

*Primary Examiner*—G. Ozaki
*Attorney, Agent, or Firm*—C. L. Menzemer

[57] ABSTRACT

A method of making a semiconductor device by first placing organic volatizable films carrying impurity diffusion material, preferably including aluminum oxide, in contact with the opposed major surfaces of at least one doped semiconductor body; and positioning the assembly in an open-tube diffusion furnace with films contacting the opposed major surfaces of the body alternately carrying N-type and P-type impurity diffusion material. The diffusion furnace is then heated to at least about 1,000°C. and preferably to at least 1,100°C. to volatilize the organic films and simultaneously diffuse the N-type and P-type impurities into the respective opposed major surfaces of the semiconductor body to form at least one PN junction therein. The semiconductor body is then preferably additionally heated to a temperature higher than about 1250°C., preferably in a nitrogen ambient, to drive the impurities into the semiconductor body and also preferably diffuse aluminum from the aluminum oxide into P impurity regions of the semiconductor body. The semiconductor body is thereafter cooled from the diffusion temperature to a temperature between about 550° and 880°C. and preferably between about 575° and 675°C at a rate less than about 3°C. per minute and preferably less than about 2°C. per minute, and thereafter cooled from said temperature to below 300°C. at a rate greater than about 25°C. per minute.

32 Claims, 11 Drawing Figures

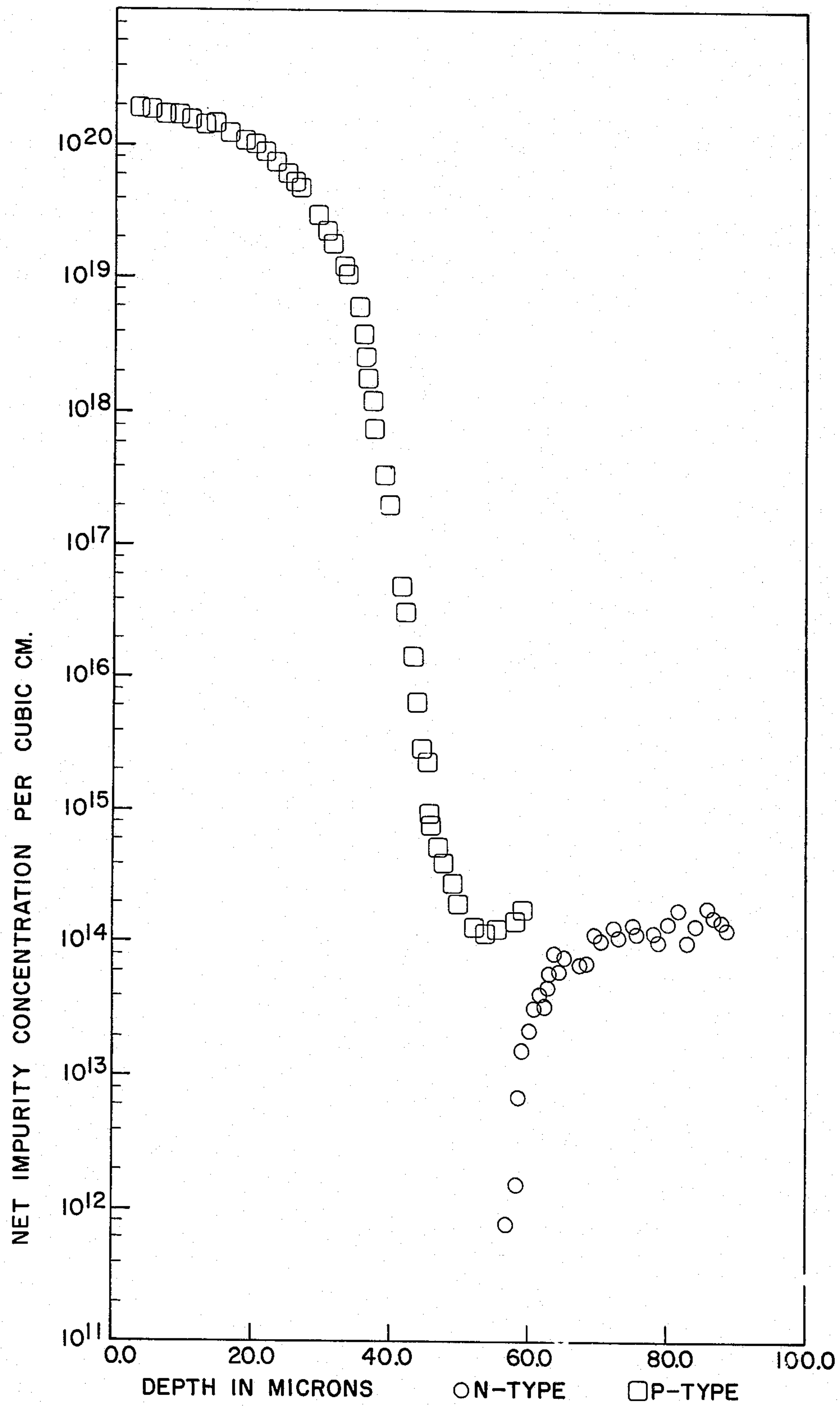
Fig. 5 AIR DRIVE-P+N JUNCTION

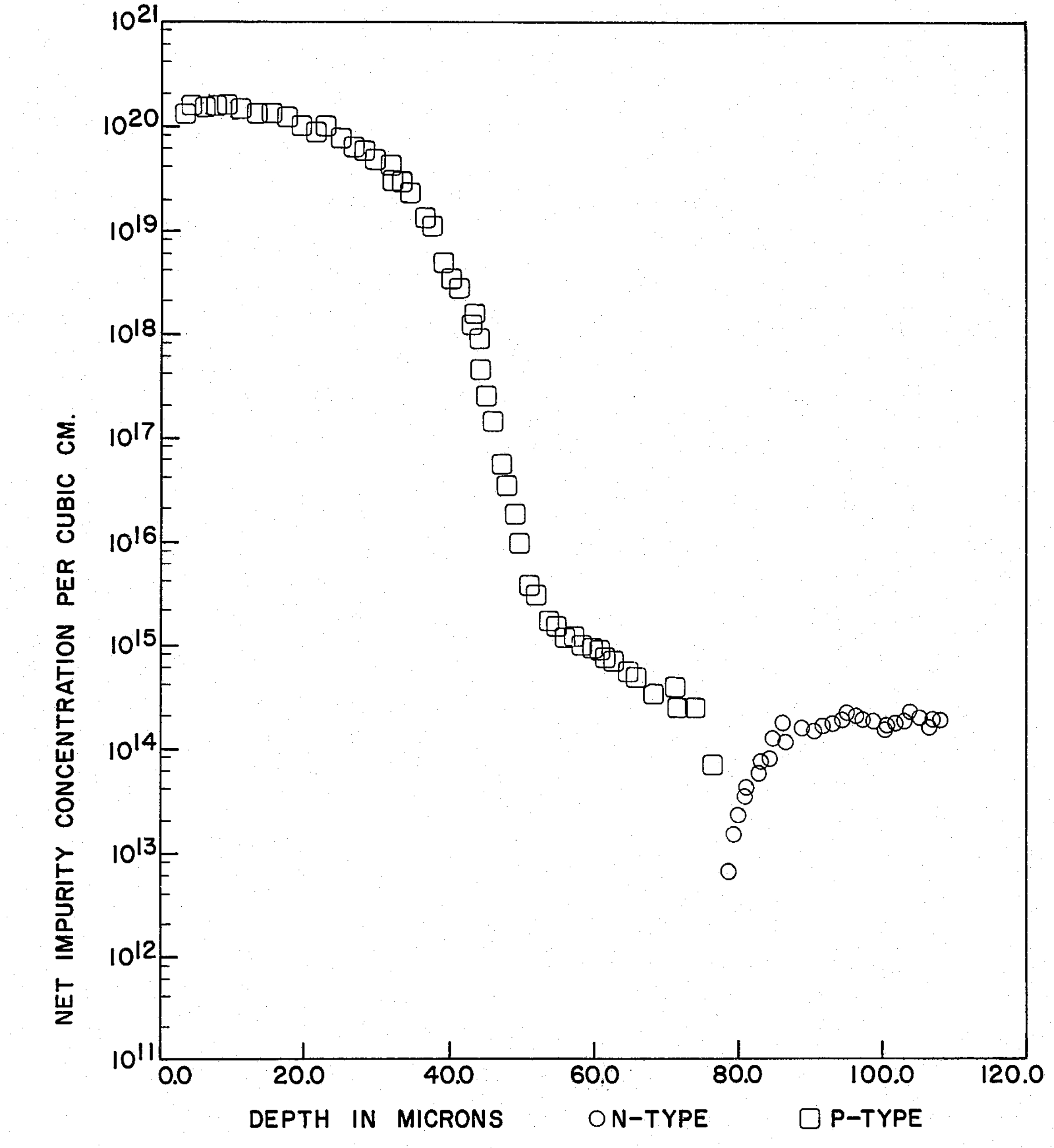
Fig. 6 NITROGEN DRIVE – P+N JUNCTION

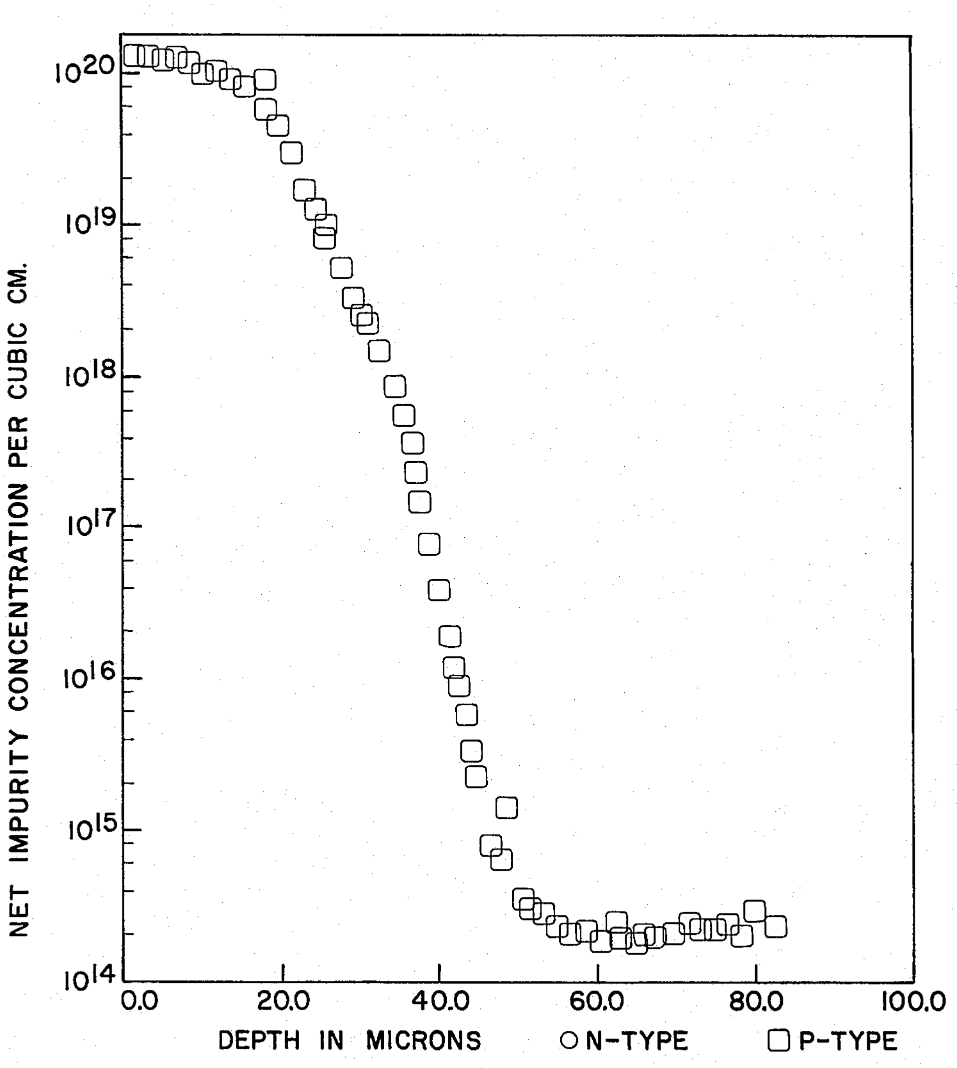
Fig. 7 N/N+ JUNCTION AIR DRIVE
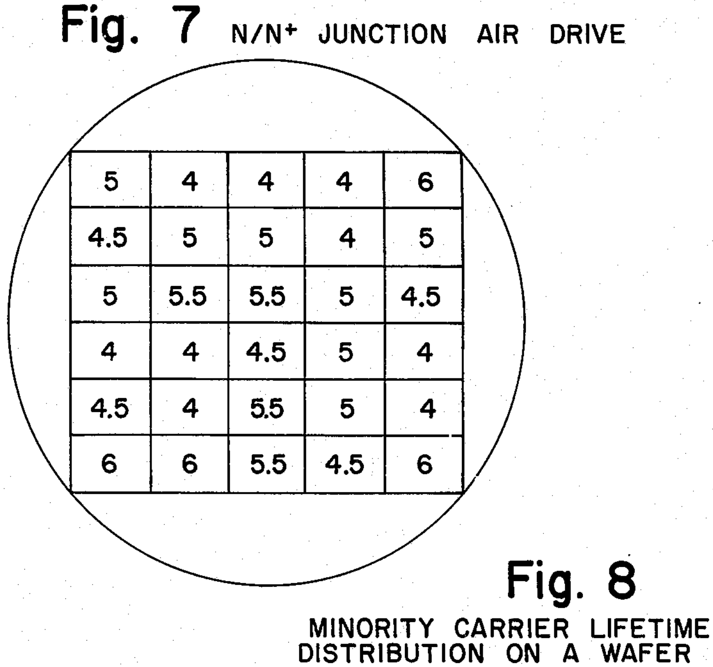
Fig. 8
MINORITY CARRIER LIFETIME DISTRIBUTION ON A WAFER

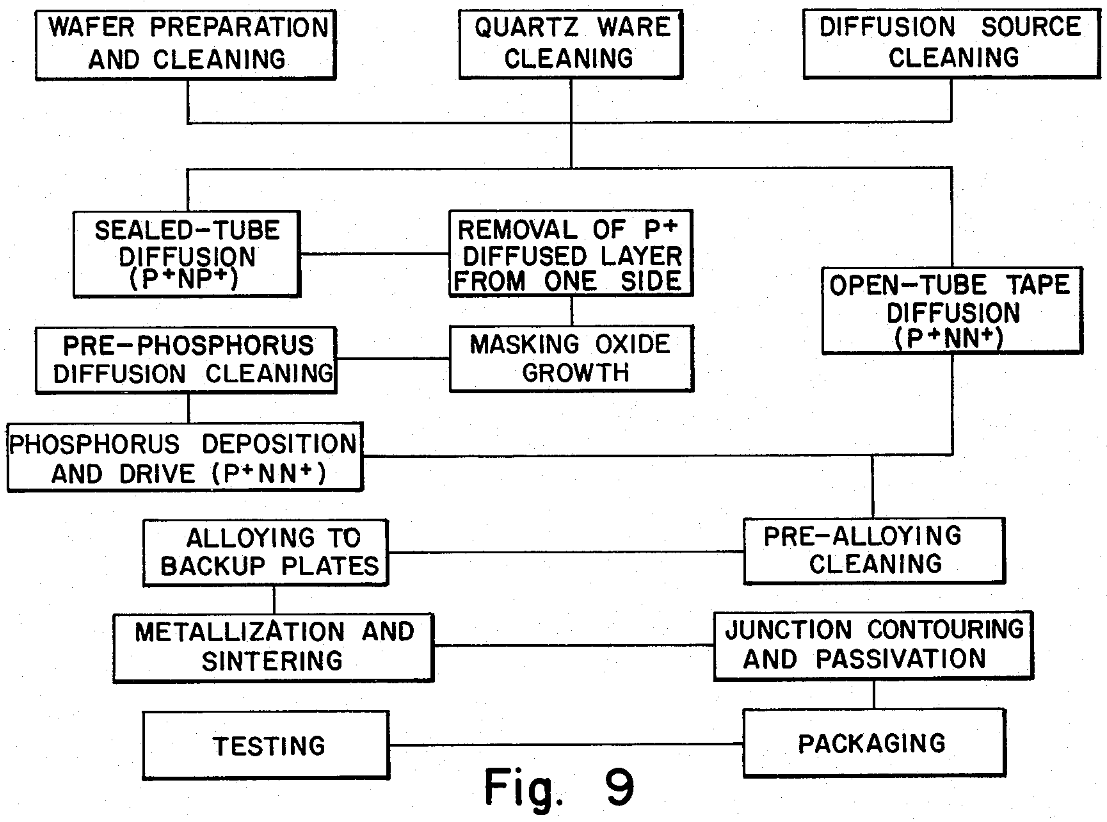
Fig. 9
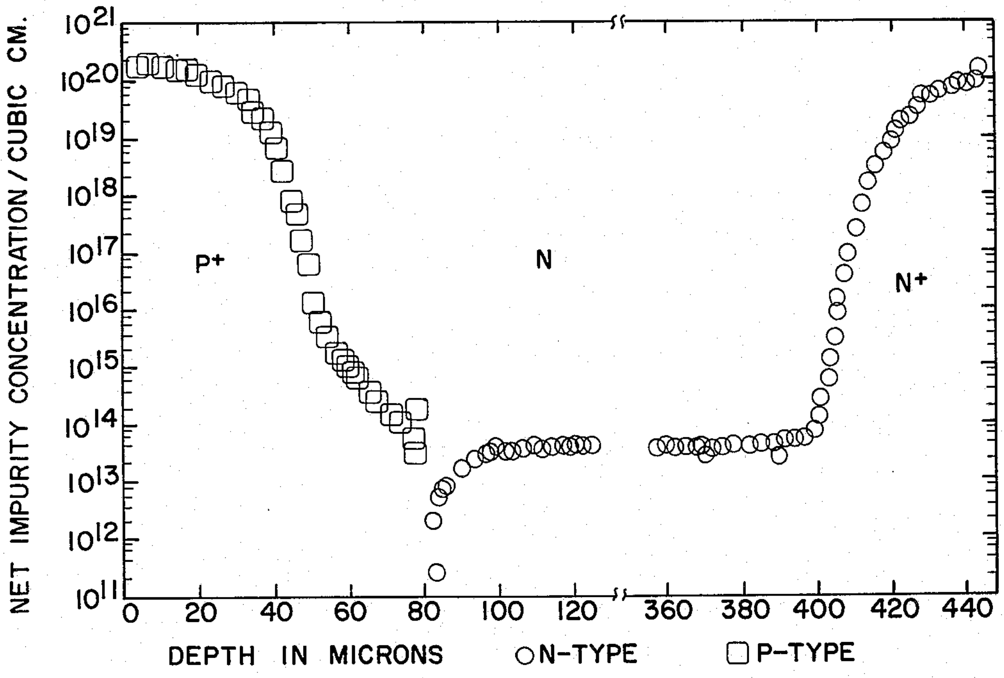
Fig. 10 CONCENTRATION PROFILE OF A RECTIFIER PRODUCED BY A SINGLE-STEP, OPEN-TUBE DIFFUSION PROCESS

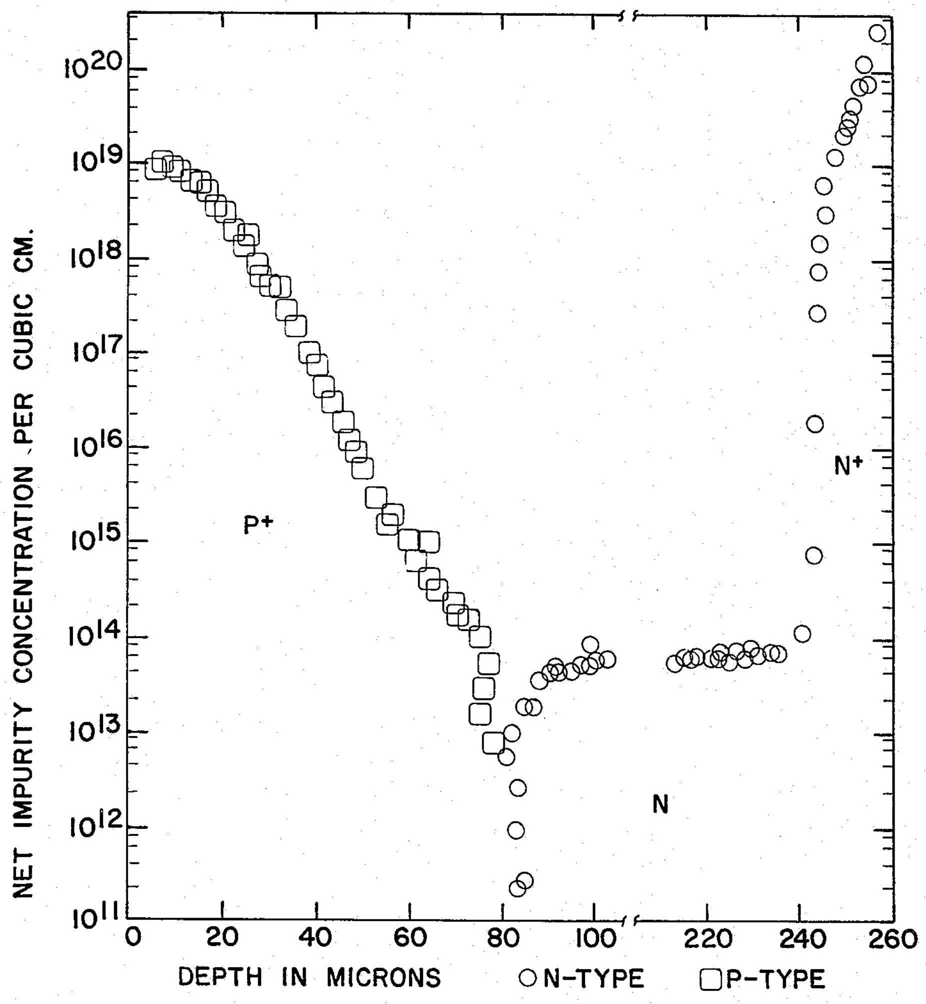
Fig. 11 CONCENTRATION PROFILE OF A RECTIFIER PRODUCED BY CONVENTIONAL SEALED-TUBE AND OPEN-TUBE DIFFUSION STEPS

METHOD OF MAKING SEMICONDUCTOR DEVICES BY SINGLE STEP DIFFUSION

FIELD OF THE INVENTION

The present invention relates to the making of semiconductor devices and particularly semiconductor devices with high voltage PN junctions.

BACKGROUND OF THE INVENTION

The trend has been to semiconductor devices such as rectifiers, transistors and thyristors with higher blocking voltage and higher current capacities. For high blocking voltage, it is retquired that the minority carrier lifetime ($\tau$) after diffusion be longer (e.g. > 20 microseconds) and be controlled within a narrow range (e.g. ±20 percent). Further, it is required that the junction depth ($x_j$) and the surface impurity concentration ($N_s$) be more uniform to increase the uniformity of device characteristics and yield. On the other hand, it is required that the diameter of the semiconductor body be made larger to increase current capacity. Accordingly, a stable and uniform diffusion furnace with large tube-size is demanded.

The diffusion methods are classified into open-tube and closed-tube methods. The open-tube methods have been applied to mass production of commercial semiconductor devices. However, open-tube methods have not provided the impurity concentration uniformity and controllability of the diffusion depth needed for devices with high blocking voltage and high voltage capacity. Specifically, the open-tube diffusion does not provide the uniformity and controllability because of the flow pattern which is necessarily present.

Closed-tube diffusion methods have been generally utilized to produce semiconductor devices with high blocking voltage capacity and high current capability. One temperature zone, sealed-tube diffusion furnaces in which no temperature difference is introduced between the impurity diffusion source and semiconductor body have been utilized for precision control of junction depth and surface impurity concentration. However, even with deep diffusions ($x_j$ > about 40 microns) where the diffusion time is long, the time and labor required for sealing the tube is a factor reducing productivity.

Moreover, difficulty has been encountered in providing the high surface concentrations together with appropriate concentration gradients for high voltage devices economically. A common N-type solid diffusion source for the open-tube method has been anhydrous phosphorus pentoxide ($P_2O_5$). However, anhydrous phosphorus pentoxide is extremely hygroscopic and is difficult, if not impossible, to load into a diffusion tube without absorbing some moisture. Presence of moisture ($H_2O$) decreases the vapor pressure of phosphorus pentoxide and results in lower surface concentrations on the semiconductor bodies. Another problem with anhydrous phosphorus pentoxide as a diffusion source is its high volatility requiring close temperature control. An alternative diffusion source of some advantage has been ammonium dihydrogen phosphate ($NH_4H_2PO_4$) because of its reduced sensitivity to moisture and lower vapor pressure eliminating the need for close temperature control.

Similarly a common P-type solid diffusion source is boron oxide ($B_2O_3$), which requires much higher source temperatures than phosphorus pentoxide. Temperature control is thus even more critical. Further, it is necessary to insert boron oxide (or $H_3BO_3$) into the diffusion tube slowly to prevent vigorous bubbling during melting. When the source boils over in the diffusion tube, the tube becomes sticky and contamination and control of the surface concentration becomes even more difficult.

In this regard, boron nitride (BN) has been used to some advantage as a diffusion source, see Goldsmith, Olmstead and Scott, RCA Review, 28, 344 (1967). A boron nitride source is normally placed between silicon wafers in close contact, and consequently the diffusion is independent of any non-uniformity arising from any flow pattern problems. However, before boron nitride can act as a source, it must be oxidized to boron oxide ($B_2O_3$) and oxidation of boron nitride is negligible up to about 800°C. At 1150°C, the oxidation rate of hot-pressed boron nitride is about 430 $\mu g/cm^2$ sec.

Further, it has been found desirable to use two ambients for the diffusion process: a mixture of oxygen and nitrogen during the deposition cycle and pure nitrogen during the drive. Diodes of lower leakage currents have been produced when the drive-in is carried out in pure nitrogen. It has been found that, if a boron nitride layer is formed by heating boron oxide ($B_2O_3$) under nitrogen ambient, it is a good getter for certain impurities, see Muraoka, Kato and Nakamura, Toshiba Review, 37, 49 (1968).

A related problem in making high voltage-high current semiconductor devices is the oxygen impurity concentration which forms donor complexes in the silicon. Float zone silicon (oxygen concentration $\approx 1 \times 10^{16}$ $cm^{-3}$) has for this reason typically been utilized. However, float zone silicon of the larger diameters needed for high current capacity devices is considerably more expensive. Czochralski silicon is, of course, lower in cost and more readily available in large diameter single crystal bodies; but it has seldom been used to produce semiconductor devices with high power capability because of the presence of high concentrations of oxygen (typically $1 \times 10^{18}$ $cm^{-3}$).

The present invention overcomes these difficulties and disadvantages of these prior manufacturing methods. It provides an open-tube method of making semiconductor devices with long controllable minority carrier lifetimes, uniformly high surface impurity concentrations and precisely controllable diffusion depths. In addition, it permits utilization of Czochralski silicon in making high power semiconductor devices. Furthermore, the method permits simultaneous diffusions of N-type and P-type impurities in the same diffusion furnace to reduce diffusion time, equipment and operating costs.

SUMMARY OF THE INVENTION

An open-tube diffusion method is provided for making a semiconductor device with at least one PN junction preferably with high reverse breakdown voltage. The method permits the utilization of readily available, low cost Czochralski silicon in the making of the semiconductor device.

The method comprises first placing organic volatizable films carrying impurity diffusion material in contact with at least one and preferably both opposed major surfaces of at least one semiconductor body. The semiconductor body is doped with an impurity concentration therethrough of a given conductivity preferably to support the reverse blocking voltage desired for the semiconductor device. The assembly is positioned in an open-tube diffusion furnace preferably with organic volatizable films contacting the opposed major surfaces of the semiconductor body alternately carrying N-type and P-type impurity diffusion materials, preferably phosphorus and boron impurity diffusion materials, and most desirably ammonium dihydrogen phosphate and boron nitride.

The diffusion furnace is then heated to a temperature higher than 1,000°C and preferably higher than 1,100°C to volatilize the organic volatizable films and diffuse the impurities into the semiconductor body. To accomplish this step, the heating is performed while maintaining an atmosphere such as a mixture of oxygen and nitrogen within the diffusion furnace suitable to support decomposition of the organic films and to activate, e.g. by oxidation, and reducing the diffusion materials for diffusion into the semiconductor body. Preferably, the semiconductor body is additionally heated in the same or another diffusion furnace in a suitable atmosphere, e.g. still air or nitrogen, to drive the impurities deeply into the semiconductor body. Most desirably, this drive heating step is performed in a nitrogen ambient so that aluminum, which is preferably in the organic films in the form of aluminum oxide, is additionally diffused only into the P impurity region of the semiconductor body.

Thereafter, the semiconductor body is cooled from the diffusion temperature to a temperature between about 550° and 800°C and preferably between about 575° and 675°C at a rate less than about 3°C per minute and preferably at a rate equal to or less than about 2°C per minute. Then the semiconductor body is cooled from said temperature to a temperature below 300°C at a rate greater than about 25°C per minute. By this cooling sequence, the formation of oxygen complexes in the semiconductor body is avoided and high resistivity and long minority carrier lifetime is maintained in the material. This sequence is most important to the use of Czochralski silicon in the making of the high voltage power device.

By this method, P+NN+ semiconductor devices can be made by diffusion even with Czochralski silicon, which have high reverse blocking voltage, high minority carrier lifetime and low leakage current. Moreover, the diffusion can be performed in a single diffusion step with the P-type and N-type impurity being simultaneously diffused into opposed major surfaces of the semiconductor body. The diffusion can thus be accomplished with reduced time, equipment and operating costs and provide higher quantitative yields.

Other details, objects and advantages of the invention will become apparent as the following description of the presently preferred embodiments of the invention and the presently preferred methods of performing the same proceeds.

BRIEF DESCRIPTION OF THE DRAWINGS

In the accompanying drawings are illustrated the preferred embodiments of the invention and presently preferred methods of practicing the same, in which:

FIG. 5 is a graph showing the impurity concentration distribution profile of a P+N junction made in accordance with the present invention;

FIG. 6 is a graph showing the impurity concentration distribution profile of an alternative P+N junction made in accordance with the present invention;

FIG. 7 is a graph showing the impurity concentration distribution profile of an N+N junction made in accordance with the present invention;

FIG. 8 is a schematic illustrating the minority carrier lifetime distribution over the surface of a silicon semiconductor body made in accordance with the present invention;

FIG. 9 is a flow chart showing the process steps for the fabrication of rectifiers by the present invention as well as a prior conventional diffusion technique;

FIG. 10 is a graph showing the impurity concentration distribution profile of a high voltage P+NN+ rectifier made in accordance with the present invention; and FIG. 11 is a graph showing the impurity concentration distribution profile of a typical P+NN+ rectifier made by conventional closed-tube and open-tube diffusion steps.

DESCRIPTION OF THE PREFERRED EMBODIMENTS

Figure 1:
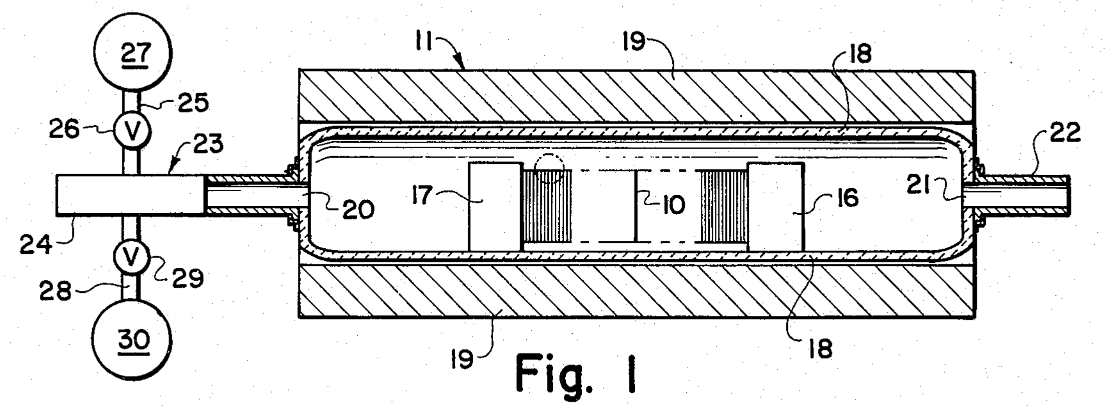
FIG. 1 is a cross-sectional view in elevation, with portions shown schematically, of apparatus suitable for performing the present invention.
Figure 2:
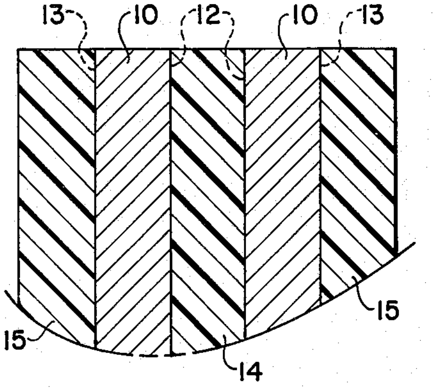
FIG. 2 is an enlarged fragmentary cross-sectional view of a portion of FIG. 1.

Referring to FIGS. 1 and 2, semiconductor bodies 10, which may be Czochralski silicon, e.g. [1,1,1] crystals of 0.3 mm in thickness and 75 mm in diameter, are stacked vertically in open-tube diffusion furnace 11. Each semiconductor body 10 has opposed major surfaces 12 and 13 and a given preferably N-type impurity concentration ($N_o$) therethrough. Each opposed major surface 12 and 13 is in contact with organic volatizable films 14 and 15, respectively, as shown in particular by FIG. 2. The semiconductor bodies 10 are thus spaced from each other by one of the organic films and are stacked in position by quartz end blocks 16 and 17 placed in quartz diffusion tube 18.

The organic films 14 and 15 typically of 1 to 2 mils in thickness may be either self-supporting or not self-supporting. The films may be placed in contact with the semiconductor bodies by spraying or any other suitable deposition method which provides intimate contact. However, the films are preferably separately formed in the form of a tape and physically placed in intimate contact with major surfaces 12 and 13 of semiconductor body 10. Typically, the volatizable organic films are cellulose, although other materials such as acrylics, nylons, polycarbonates, polyesters, polyethylenes, polyimides, polypropylenes, polystyrenes, polyurethanes, polyvinylchlorides, polyvinylfluorides, polyacetates, epoxies, phenolics, urea-formaldehydes, polyamides, polyimideamides, polybutylenes, polytetrafloroethylenes and the like are contemplated for use.

The organic films 14 and 15 carry N-type and P-type impurity diffusion materials, respectively. Anhydrous phosphorus pentoxide ($P_2O_5$) and boron nitride ($B_2O_3$) are suitable diffusion materials. However, ammonium dihydrogen phosphate ($NH_4H_2PO_4$) is preferably utilized as the N-type diffusion material, and boron nitride (BN) is preferably utilized as the P-type diffusion material. In any case, the organic films 14 and 15 are typically cellulose tapes also carrying aluminum oxide ($Al_2O_3$) powder to prevent the tapes from sticking. The tapes are loaded with the diffusion material by soaking in a slurry of the impurity diffusion material. Most preferably, the N-type tape contains about 35% ammonium dihydrogen phosphate ($NH_4H_2PO_4$), and the P-type tape contains about 10% boron nitride (BN). By this arrangement, organic films 14 and 15 in contact with opposed major surfaces 12 and 13 of each semiconductor body alternately carry N-type and P-type diffusion materials.

Preparatory to loading into diffusion furnace 11, semiconductor bodies 10 are lap etched and then cleaned by detergents, degreasing, chemically etching, chelating and rinsing. Typically, etching of lapped bodies is done by hydrofluoric-nitric acid ($HF—HNO_3$) mixture. A typical cleaning procedure includes rinsing in acetone, boiling in trichloroethylene with ultrasonic agitation for 1 minute, rinsing in acetone, rinsing in deionized water, boiling in detergent solution with ultrasonic agitation for two 3-minute periods, boiling in deionized water with ultrasonic agitation for five 1-minute periods, and drying under a heat lamp for 30 minutes. After storage in a clean container, the cleaning cycle is then continued by soaking the semiconductor bodies in concentrated hydrofluoric solution ($HF:H_2O::1:1$) for 10 minutes, rinsing in deionized water several times, boiling in concentrated ammonium hydroxide-peroxide chelate ($NH_4OH:H_2O_2:H_2O::1:1:3$) for 30 minutes, rinsing in deionized water, boiling in concentrated hydrochloric acid-peroxide chelate ($HCl:H_2O_2:H_2O::1:1:3$) for 30 minutes, and rinsing in deionized water. Thereafter, the semiconductor bodies are typically rinsed in hot deionized water using ultrasonic agitation three times, and then dried under a heat lamp for 30 minutes. Such lapping and cleaning procedures are believed important to provide good, intimate contact between the semiconductor bodies and the organic films.

The diffusion furnace 11 is comprised of cylindrical quartz diffusion tube 18, in which the semiconductor bodies 10 are vertically stacked in contact with organic films 14 and 15, surrounded by resistance heater 19, which is standard in such resistance furnaces. Quartz tube 18 has inlet opening 20 to provide for flow of suitable gas or gases as hereafter described into the tube, and outlet opening 21 to provide for flow of gases and volatiles from the diffusion tube. Tube 18 is typically cleaned by degreasing, etching, chelating and rinsing procedures similar to those above described to prepare the semiconductor bodies.

Outlet opening 21 is preferably hermetically sealed to a quartz conduit 22 to move gases and volatiles from diffusion tube 18. A cold trap is usually provided to remove volatile materials formed on the decomposition of the organic films as hereafter described.

Hermetically connected to inlet opening 20 is gas feed assembly 23 to provide for the flow of gases necessary to the diffusion tube 18. Feed assembly 23 preferably includes mixer chamber 24 hermetically sealed through conduit 25 to inlet opening 20. Mounted for inlet to mixer 24 through conduit 25 and valves 26 from pressurized vessel 27 and for inlet to mixer 24 through conduit 28 and valve 29 from pressurized vessel 30 are gases, such as oxygen, air or nitrogen, suitable to support the diffusion.

The diffusion cycle is commenced by heating diffusion furnace 11 to a temperature above 1,000°C and preferably above 1,100°C and typically between 1,100° and 1,125°C. Concurrently, gas is let into to and through diffusion tube 18 from feed assembly 23 to support the diffusion. The gas is typically oxygen, air, or a mixture of oxygen and nitrogen. The oxygen provides for oxidation of the diffusion materials so that the impurities can be deposited on and diffused into the semiconductor bodies. Alternately, where the diffusion materials do not require oxidation or reduction, an inert gas such as argon may be utilized through the diffusion tube. Most preferably the diffusion deposition is performed in a 1:1 mixture of oxygen and nitrogen at about 1,100°C for 4 hours. In any case, the heating results in a simultaneous uniform high surface impurity concentration (i.e. $> 1 \times 10^{20}$ atoms/cm$^3$) of both N-type and P-type impurities on major surfaces 12 and 13, respectively, of each semiconductor body 10.

During the diffusion, the organic films 14 and 15 are volatilized, and the volatiles carried away with the gas flow. The volatilization of the organic films also tends to fuse the semiconductor bodies and decomposition product of the organic films into a singular mass. Preferably, the films are completely volatilized. Also, boron nitride is activated by oxidation to boron oxide if it is one of the diffusion materials, and ammonium dihydrogen phosphate is activated by decomposition to phosphorus pentoxide if it is one of the diffusion materials. The oxides are subsequently reduced by silicon to boron and phosphorus for diffusion into the semiconductor bodies.

The diffusion tube 18 is then purged of gases. The semiconductor bodies 10 are then preferably heated to greater than about 1,250°C for at least 25 hours in an atmosphere of still air or nitrogen to drive the diffusion impurities to the desired depth and provide the desired impurity concentration profile. The drive may be performed in a second diffusion furnace. Preferably the drive is performed in any case in a nitrogen atmosphere to preferably diffuse aluminum of the aluminum oxide in the organic films preferentially into the P-type impurity regions.

After the diffusion, the semiconductor bodies are slowly cooled to a temperature between about 575° and 800°C and preferably between about 575° and 675°C at a rate less than about 3°C per minute, and preferably at about 2°C per minute or less. Typically, this slow cooling is accomplished by sitting at the open end of the furnace after the diffusion and drive steps. Thereafter, the semiconductor bodies are cooled from said temperature to below 300°C at a rate greater than about 25°C per minute. Typically, this rapid cooling is accomplished by manually withdrawing the semiconductor bodies from the furnace. The formation of oxygen complexes which produce donor complexes is thus avoided, and reasonably high resistivity (e.g. $> 60$ ohm-cm) and long minority carrier lifetimes semiconductor bodies are maintained. High voltage power devices up to 2 kilovolts can thus be fabricated using Czochralski silicon.

Thereafter, the fused semiconductor bodies and volatilized organic films are separated. The separation is typically accomplished by soaking in a 49% solution of hydrofluoric acid. The boron diffused surface of the separated semiconductor bodies usually acquires a hydrogen fluoride insoluble skin of about 8 microns in thickness. Such insoluble skin is removed by etching in a 49% nitricphosphoric-hydrofluoric acid solution (conc.$HNO_3$:conc.$H_3PO_4$:conc.HF::7:1:1).

Figure 3:
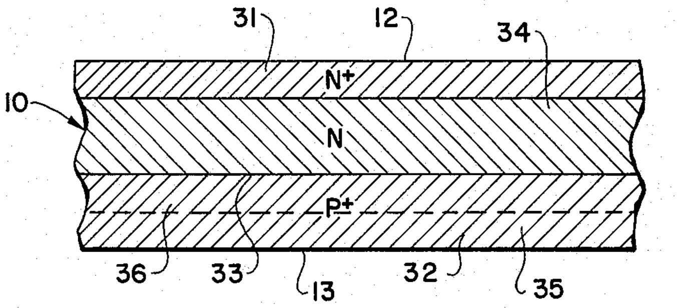
FIG. 3 is a cross-sectional view in elevation of a P+NN+ power rectifier made in accordance with the present invention.

Referring to FIG. 3, each diffused semiconductor body 10 has a P+NN+ structure which requires only contacting and passivation to provide a high voltage rectifier. Each semiconductor body 10 has a N+ impurity region 31 adjoining major surface 12 formed substantially by the diffusion of N-type impurity from organic film 14, and P+ impurity region 32 adjoining major surface 13 formed by diffusion of P-type impurity from organic film 15. P+ impurity region 32 forms with the residual N-type impurity provided in the semiconductor body 10, as grown, a PN junction 33. Also provided in the interior of semiconductor body 10 between N+ impurity region 31 and P+ impurity region 32 is N impurity region 34 which supports most of the reverse blocking voltage of the structure. It should also be noted that when the drive diffusion is performed in nitrogen atmosphere as above described, the P+ impurity region 32 divides itself into first and second portions 35 and 36. Impurity portion 35 adjoins major surface 13 and is formed primarily by the diffusion of the slow diffusing impurity or impurities (e.g. boron), and second impurity portion 36 adjoins PN junction 33 and is formed substantially in its entirety by the fast diffusing aluminum.

Figure 4:
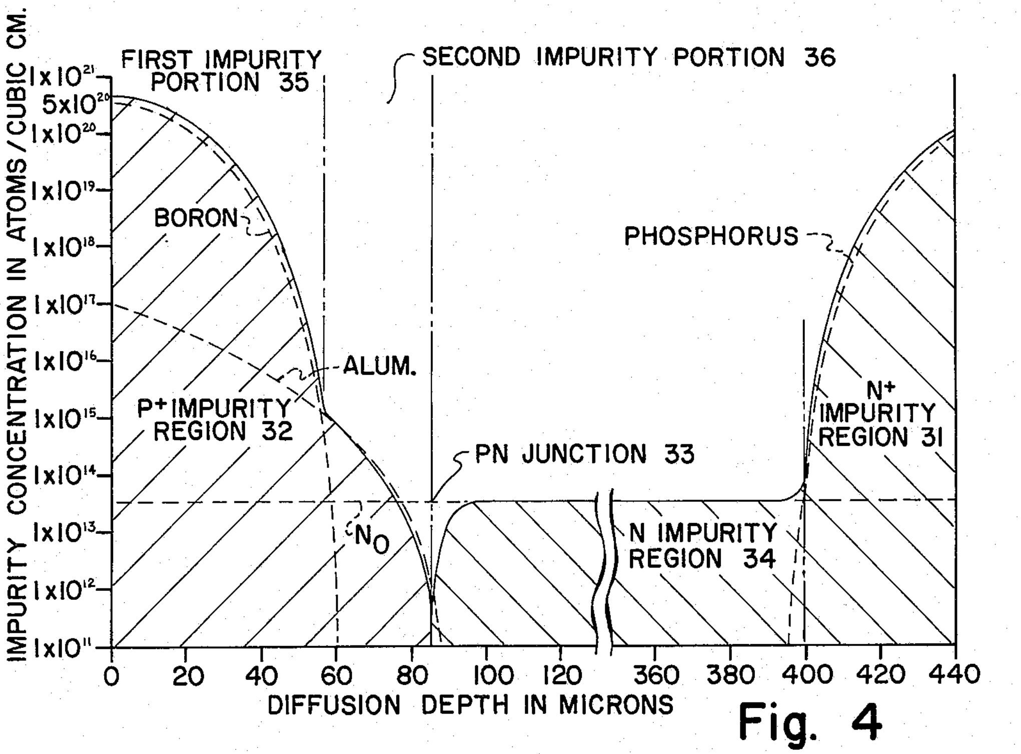
FIG. 4 is a graph illustrating the impurity concentration profile of the diffused semiconductor body in FIG. 3.

To better understand the resulting diffusion profile formed by the single step diffusion, reference is made to FIG. 4. There the impurity concentration profile through the semiconductor body 10 is illustrated by the solid curve. That is, the net impurity concentration in atoms/$cm^3$ of uncompensated impurity through the semiconductor body.

The P+NN+ rectifier is completed by contacting, contouring or beveling, and passivating. The metal contacts (not shown) are fixed to major surface 12 by metallization, for example, by evaporating aluminum to a thickness of about 60,000 A and subsequently annealing to form the ohmic contact to N+ impurity region 31; and soldering a back-up plate or electrode of, for example molybdenum or tungsten to major surface 13 to make ohmic contact to P impurity region 32. The semiconductor body is subsequently contoured by, for example spin-etching to reduce the surface field in the neighborhood of the PN junction. Finally, the beveled surfaces are passivated by coating them with a protective coating (not shown) of, for example, 1,2-dihydroxyanthraquinone with an epoxy or silicone resin.

To illustrate the operation of the invention, silicon P+NN+ rectifiers were built and tested in accordance with the present invention. Specifically, silicon wafers of Czochralski grown and float-zone crystals were utilized having a diameter 75 mm and a thickness of 0.3 mm. The crystal orientation of the wafers at the major surfaces were [1,1,1] and [1,0,0]. The wafers were lapped and cleaned following procedures above described. Some of the wafers were not chemically etched and chelated in order to determine the importance of removing the surface damage and chelating in the fabrication of semiconductor devices of deep diffusions by the present method.

Cellulose films in the form of tapes were obtained containing aluminum oxide powder in order to prevent the tapes from sticking. The N-type tapes contained about 36% ammonium dihydrogen phosphate ($NH_4H_2PO_4$), and the P-type tapes contained about 10% boron nitride (BN). The cellulose tapes were of about 1.5 mils in thickness and were utilized without further cleaning.

The semiconductor wafers were loaded vertically into a quartz diffusion boat with the N-type and P-type tapes alternately positioned between the major surfaces of adjacent semiconductor wafers. The wafers were stacked vertically between alumina dishes, and quartz or lava wedges were forced between the quartz boat and alumina dish to compress the silicon wafers.

The diffusion was carried out in two furnaces. The first was the deposition furnace where the loaded quartz boats were heated in a mixture of oxygen and nitrogen ($O_2$:$N_2$::1:1) at about 1,100°C for about four hours. The flow rate through the diffusion tube was adjusted to 10 liters per minute. In this portion of the diffusion cycle, the cellulose was completely volatilized, the boron nitride was activated to boron oxide ($B_2O_3$), and the ammonium to hydrogen phosphate was activated to anhydrous phosphorus pentoxide ($P_2O_5$). It should be noted that during the first part of the deposition diffusion that care was taken so that the cellulose was decomposed with minimum ignition. The silicon bodies were thus simultaneously heavily doped on the opposite major surfaces with phosphorus and boron dopants, and the major surfaces were covered with the dopant glasses.

The loaded quartz boats were subsequently removed from the deposition furnace and loaded into a second diffusion furnace. There the dopants were diffused by a drive diffusion at a temperature of about 1,250°C for 25 hours. This part of the diffusion was done in two batches. The first batch was driven in an atmosphere of still air. The second batch was driven in pure nitrogen at a flow rate of 10 liters/minute.

After the drive, the semiconductor bodies were cooled in the diffusion furnace at a rate of about 2°C per minute from the diffusion temperature to a temperature of about 650°C. Thereafter, the semiconductor bodies were removed from the diffusion furnace and quenched to cool them from a temperature of 650°C to room temperature at a cooling rate of about 25°C per minute.

The diffused wafers were then soaked in a 49% solution of hydrofluoric acid to separate them from each other. The boron doped side of the separated wafers usually had a skin insoluble in hydrofluoric acid of about 8 microns in thickness. This skin was removed by etching the semiconductor bodies in a 49% nitric-phosphorichydrofluoric acid solution (conc.-$HNO_3$:conc.$H_3PO_4$:conc.HF::7:1:1).

The impurity concentration profiles were then measured by the spreading resistance technique, see Mazur and Dickey, J. Electrochem. Soc., 113, 255 (1966), and the minority carrier lifetimes in the N base regions were measured by the open circuit decay method, see Davies, Proc. IEEE, 5th, 1637 (1963). Mass spectroscopy was utilized to check the presence of any undesirable impurities in the surface glasses and the silicon bodies following diffusion, and any diffusion induced damage and defects were examined by electron microscopy and x-ray topography (the results of the tests are shown in FIGS. 5 through 8).

Referring to FIG. 5, the measured impurities concentration profile is shown for the P+ impurity region and the P+N junction where the drive diffusion was performed with still air. The graph shows that where the drive diffusion was carried out in still air, that boron was diffused into the silicon without any significant incorporation of aluminum from the aluminum oxide in the cellulose films. The concentration profile does show a desirably high surface concentration of about $2 \times 10^{20}$ atoms/$cm^3$ of boron, and a PN junction depth of 55 microns.

Referring to FIG. 6, the measured impurity concentration profile is shown for the P+ impurity region and the P+N junction where the drive diffusion was performed in nitrogen atmosphere. The concentration profile shows a diffusion into the silicon of a significant amount of aluminum from the aluminum oxide. Indeed, for the same diffusion and drive time and temperature as used for still air, the junction depth is increased to about 77 microns with the same high surface concentration of about $2 \times 10^{20}$ atoms/$cm^3$.

Referring to FIG. 7, the measured impurity concentration profile is shown for the N+ impurity region and the NN+ junction where the drive diffusion was performed in still air. A similar measured impurity concentration was made for the N+ impurity region and the NN+ junction where the drive was performed in nitrogen. The shape of the profile was found not to be significantly different when the nitrogen atmosphere was substituted for the still air atmosphere during the drive diffusion. Further, the graph shows the high surface concentration of about $2 \times 10^{20}$ atoms/$cm^3$, which is desirable to form a low resistance ohmic contact. Note also that no aluminum was incorporated with the phosphorus, which would have been detrimental.

Referring to FIG. 8, the measured minority carrier lifetime showed a relatively uniform and low minority carrier lifetime over the surface of the silicon wafer. The values ranged from 4 to 6 microseconds. The uniformity of minority carrier lifetime values over such a large area indicates that the damaged silicon on the lapped surface is acting as a sink for heavy metals and other lifetime killing impurities.

Similar lifetime measurements performed on the silicon wafer using the nitrogen atmosphere during the drive diffusion increase the minority carrier lifetime by a factor of 5. Minority carrier lifetimes as high as 37 microseconds were measured. This increase clearly demonstrates some gettering action when the drive diffusion is performed in a nitrogen ambient. The additional gettering effect from the damaged surface was also observed.

It was also observed that lapped wafers consistently resulted in higher minority carrier lifetime measurements than etched wafers, although this effect does not seem to be of very great significance.

Breakdown voltages of the P+N junctions were also measured. The P+N junctions formed utilizing still air ambient during the drive diffusion typically had a breakdown voltage of about 800 volts. P+N junctions were formed utilizing the nitrogen ambient during the drive diffusion where aluminum was incorporated into the P+ impurity region; breakdown voltages as high as 2,600 volts were obtained utilizing float-zone silicon andd 2,000 volts utilizing Czochralski silicon.

The other measurements on the semiconductor bodies showed that both the N-type and P-type diffusions produced a considerable number of defects. However, these defects were found to be confined to the heavily doped regions of the semiconductor body where their effects on the device parameters, e.g. in junction efficiency, voltage breakdown, etc. was minimized.

To further illustrate and compare the invention with previous diffusion methods, 3-inch diameter rectifiers were made using [1,1,1] Czochralski silicon and [1,0,0] float-zone silicon. Most of the silicon wafers were doped N-type with phosphorus to an impurity concentration of $1 \times 10^{14}$ atoms/$cm^3$. Some of the float-zone silicon wafers were lighter doped N-type with phosphorus to an impurity concentration of $5 \times 10^{13}$ atoms/$cm^3$.

Referring to FIG. 9, the silicon bodies were fabricated into rectifiers using the process steps there described. As shown by FIG. 10, some P+NN+ rectifier structures were made using the single-step open-tube diffusion above described. Referring to FIG. 11, the other P+NN+ rectifier structures were made by a conventional diffusion technique comprising (i) a closed-tube boronaluminum-gallium diffusion, (ii) removal of the P+ layer at one major surface of the body, and (iii) an open-tube diffusion using $PH_3$ as the diffusion source. The drive for the single step diffusions were performed in still air or nitrogen ambient as above described. The drive for the conventional diffusions were performed in a standard oxidizing ambient such as water vapor or oxygen.

The P+NN+ structures were each cooled as above described in connection with rectifiers whose electrical characteristics are shown in FIGS. 5–8 except that the slow cooling step was stopped and the rapid cooling step started at 600°C instead of 650°C.

The impurity concentration profiles and minority carrier lifetimes of the rectifiers were then measured utilizing the spreading resistance technique and open circuit decay method referenced above.

Referring to FIG. 10, the measured concentration profile for the P+NN+ structure produced by the same single step open-tube diffusion method is shown. The minority carrier lifetime in the semiconductor bodies was found to be typically in the neighborhood of 25 to 35 microseconds.

Referring to FIG. 11, the measured concentration profile for the P+NN+ structure produced by the conventional diffusion technique is shown. Although the semiconductor body was considerably smaller in thickness, and accordingly the device had a lower blocking voltage, it can be seen that the impurity concentration profile is inferior to that produced with the single-step open-tube diffusion, and with considerably more diffusion steps to reduce the quantitative yield of the devices.

To compare minority carrier lifetimes, devices with base widths comparable to those shown in FIG. 10 were also prepared by the conventional sealed-tube process above described. Through various improvements in technique, the minority carrier lifetime of 75 microseconds was achieved in these devices. High voltage devices from sealed-tube diffusion would also tend to be limited by surface passivation rather than any defects in the NN+ interface and would, therefore, be superior to the devices produced by the single step open-tube process. However, such devices could not be competitively produced with the low costs of the single step open-tube process.

The reason for the preferential diffusion of the aluminum into the P+ impurity region in the presence of the nitrogen ambient, while not diffusing into the N+ impurity region, is not entirely understood. The best explanation which is known at present is believed to be as follows:

Considering the case of boron diffusion first, boron nitride in the cellulose tape must be activated by heating in oxygen. This creates a skin of boron oxide ($B_2O_3$) which acts as a diffusion source. However, in the presence of aluminum oxide ($Al_2O_3$) several boroaluminates are formed which are less volatile. The liquidus curve rises continuously from the melting point of boron oxide ($B_2O_3$) at 470°C, see P. J. M. Gielisse and W. R. Foster, Nature, 195, 69 (1962). During the diffusion heat treatment, silicon wafers are also oxidized. Significant interaction between aluminum oxide ($Al_2O_3$) and silicon dioxide ($SiO_2$) may not be expected at the typical diffusion temperatures (the eutectic temperature is 1595°C). The interaction between the $B_2O_3$—$Al_2O_3$ glass and the surface oxide of silicon is probably very slow, see P. J. M. Gielisse and W. R. Foster, Quart. Progr. Rept., 931-8, The Ohio State Univ. Res. Foundation, p.6, Oct. (1961). Therefore, it is necessary for silicon dioxide ($SiO_2$) to react directly with boron oxide ($B_2O_3$) to form a borosilicate glass that could act as a diffusion source. If the redistribution heat treatment is carried out in air or oxygen all the boron nitride will become oxidized and very little aluminum is available for diffusion. When the redistribution heat treatment is carried out in nitrogen a significant quanitity of boron nitride (BN) still remains on the wafer surface, and could react with aluminum oxide ($Al_2O_3$) to produce boron oxide ($B_2O_3$) and aluminum nitride (AlN). This reaction is energetically highly favored. It is contemplated that more aluminum (Al) is available for diffusion from aluminum nitride (AlN) than form aluminum oxide ($Al_2O_3$).

Ammonium dihydrogen phosphate ($NH_4H_2PO_4$), like boron nitride (BN) is contained in a cellulose tape, and is mixed with aluminum oxide ($Al_2O_3$). First we will discuss the modes of decomposition of ammonium dihydrogen phosphate ($NH_4H_2PO_4$) as a function of temperature, followed by its interaction with aluminum oxide ($Al_2O_3$) and silicon oxide ($SiO_2$). Thermogravimetric analysis indicates that at about 200°C, ammonium dihydrogen phosphate ($NH_4H_2PO_4$) decomposes to $H_4P_2O_7$ through loss of ammonia ($NH_3$) and water ($H_2O$). At about 330°C further decomposition to phosphorus pentoxide ($P_2O_5$) and water ($H_2O$) takes place. In the absence of alumina, volatilization of phosphorus pentoxide ($P_2O_5$) is completed when the temperature reaches about 650°C. Aluminum oxide ($Al_2O_3$) reacts with phosphorus pentoxide ($P_2O_5$) to form stable aluminum phosphate ($AlPO_4$) and thus retains about 37% of the initial phosphorus in the tape (~ 10.14 wt. percent). Aluminum phosphate ($AlPO_4$) does not form any solid solution with silicon dioxide ($SiO_2$), see P. Robinson and E. R. McCartney, J. Am. Ceramic Soc., 47, 587 (1964), and as a consequence no evidence of aluminum diffusion is found near the N—N+ junction. The remainder of the phosphorus pentoxide ($P_2O_5$) reacts with silicon dioxide ($SiO_2$) of the oxidized silicon wafers to form phosphosilicate glass. The high volatility of phosphorus pentoxide ($P_2O_5$) causes the formation of an N-type skin around the perimeter of the P-diffusion side of the wafer, probably due to relatively rapid interaction between phosphorus pentoxide ($P_2O_5$) and silicon dioxide ($SiO_2$).

While the present preferred embodiments have been shown and described with particularity, it is distinctly understood that the invention may be otherwise variously performed within the scope of the following claims.

What is claimed is:

1. A method of making a semiconductor device comprising the steps of:

A. contacting volatizable organic films carrying impurity diffusion material to opposed major surfaces of at least one doped semiconductor body in an open-tube diffusion furnace, with the films contacting the opposed major surfaces of each semiconductor body alternately carrying N-type and P-type impurity diffusion materials;

B. heating the diffusion furnace to a temperature higher than about 1,000°C to volatilize the organic films and to diffuse the N and P-type impurities simultaneously into the respective opposed major surfaces of the semiconductor body to form at least one PN junction therein;

C. slowly cooling the semiconductor body to a temperature between about 550° and 800°C at a rate less than about 3°C per minute; and D. thereafter rapidly cooling the semiconductor body from said temperature to below about 300°C at a rate greater than about 25°C per minute.

2. The method of making a semiconductor device as set forth in claim 1 wherein:

in step B, the heating of the diffusion furnace is to a temperature higher than about 1,100°C.

3. The method of making a semiconductor device as set forth in claim 1 comprising in addition between the heating and slow cooling steps:

additionally heating the semiconductor body in a diffusion furnace to a temperature of at least about 1,250°C to drive the impurities into the semiconductor body.

4. A method of making a semiconductor device as set forth in claim 1 wherein:

said volatizable organic films in contact with the opposed major surfaces of each semiconductor body alternately carry phosphorus and boron diffusion materials.

5. A method of making a semiconductor device as set forth in claim 4 wherein:

said volatizable organic films in contact with the opposed major surfaces of each semiconductor body alternately carry ammonium dihydrogen phosphate and boron nitride.

6. A method of making a semiconductor device as set forth in claim 4 where in addition:

each said volatizable organic film in addition carries aluminum oxide.

7. A method of making a semiconductor device as set forth in claim 6 comprising in addition between the heating and slow cooling steps:

additionally heating the semiconductor body in a diffusion furnace to a temperature of at least about 1,250°C, while maintaining a nitrogen atmosphere in the diffusion furnace, to drive the impurities into the semiconductor body and diffuse aluminum into P-type impurity regions of the semiconductor body.

8. The method of making a semiconductor device as set forth in claim 1 wherein:

in step C, the slow cooling is to a temperature between about 575° and 675°C at a rate less than about 2°C per minute.

9. A method of making a semiconductor device as set forth in claim 8 wherein:

said volatizable organic films in contact with the opposed major surfaces of each semiconductor body alternately carry phosphorus and boron diffusion materials.

10. A method of making a semiconductor device with a high voltage PN junction by single step diffusion as set forth in claim 9 wherein:

said volatizable organic films in contact with the opposed major surfaces of each semiconductor body alternately carry ammonium dihydrogen phosphate and boron nitride.

11. A method of making a semiconductor device as set forth in claim 9 where in addition:

each said volatizable organic film in addition carries aluminum oxide.

12. A method of making a semiconductor device as set forth in claim 11 comprising in addition between the heating and slow cooling steps:

additionally heating the semiconductor body in a diffusion furnace to a temperature of at least about 1,250°C, while maintaining a nitrogen atmosphere in the diffusion furnace, to drive the impurities into the semiconductor body and diffuse aluminum into P-type impurity regions of the semiconductor body.

13. A method of making a semiconductor device utilizing Czochralski silicon comprising the steps of:

A. contacting volatizable organic films carrying impurity diffusion material to opposed major surfaces of at leat one doped semiconductor body of Czochralski silicon in an open-tube diffusion furnace, with the films contacting the opposed major surfaces of each semiconductor body alternately carrying N-type and P-type impurity diffusion materials;

B. heating the diffusion furnace to a temperature higher than about 1,000°C to volatilize the organic films and diffuse the N and P-type impurities simultaneously into the respective opposed major surfaces of each semiconductor body to form at least one PN junction therein;

C. slowly cooling the semiconductor body to a temperature between about 550° and 800°C at a rate less than about 3°C per minute; and D. thereafter rapidly cooling the semiconductor body from said temperature to below about 300°C at a rate greater than about 25°C per minute.

14. The method of making a semiconductor device as set forth in claim 13 wherein:

in step B the heating of the diffusion furnace is carried to a temperature higher than about 1,100°C.

15. The method of making a semiconductor device utilizing Czochralski silicon as set forth in in claim 13 comprising in addition between the heating and slow cooling steps:

additionally heating the semiconductor body in a diffusion furnace to a temperature of at least about 1,250°C to drive the impurities into the semiconductor body.

16. A method of making a semiconductor device utilizing Czochralski silicon as set forth in claim 13 wherein:

said volatizable organic films in contact with the opposed major surfaces of each semiconductor body alternately carry phosphorus and boron diffusion materials.

17. A method of making a semiconductor device utilizing Czochralski silicon as set forth in claim 16 wherein:

said volatizable organic films in contact with the opposed major surfaces of each semiconductor body alternately carry ammonium dihydrogen phosphate and boron nitride.

18. A method of making a semiconductor device utilizing Czochralski silicon as set forth in claim 16 where in addition:

each said organic film in addition carries aluminum oxide.

19. A method of making a semiconductor device utilizing Czochralski silicon as set forth in claim 18 comprising in addition between the heating and slow cooling steps:

additionally heating the semiconductor body in a diffusion furnace to a temperature of at least about 1,250°C, while maintaining a nitrogen atmosphere in the diffusion furnace, to drive the impurities into the semiconductor body and diffuse aluminum into P-type impurity regions of the semiconductor body.

20. The method of making a semiconductor device utilizing Czochralski silicon as set forth in claim 13 wherein:

in Step C, the slow cooling is to a temperature between about 575° and 675°C at a rate less than about 2°C per minute.

21. A method of making a semiconductor device utilizing Czochralski silicon as set forth in claim 20 wherein:

said volatizable organic films in contact with the opposed major surfaces of each semiconductor body alternately carry phosphorus and boron diffusion materials.

22. A method of making a semiconductor device utilizing Czochralski silicon as set forth in claim 21 wherein:

said volatizable organic films in contact with the opposed major surfaces of each semiconductor body alternately carry ammonium dihydrogen phosphate and boron nitride.

23. A method of making a semiconductor device utilizing Czochralski silicon as set forth in claim 21 where in addition:

each said organic film in addition carries aluminum oxide.

24. A method of making a semiconductor device utilizing Czochralski silicon as set forth in claim 23 comprising in addition between the heating and cooling steps:

additionally heating the semiconductor body in a diffusion furnace to a temperature of at least about 1,250°C, while maintaining a nitrogen atmosphere in the diffusion furnace, to drive the impurities into the semiconductor body and diffuse aluminum into P-type impurity regions of the semiconductor body.

25. A method of making a semiconductor device comprising the steps of:

A. contacting a volatizable organic film carrying at least one impurity diffusion material to a major surface of at least one semiconductor body;

B. heating the diffusion furnace to a temperature higher than about 1,000°C to volatilize the organic film and to diffuse impurities into the major surface of the semiconductor body;

C. cooling the semiconductor body to a temperature between about 550° and 800°C at a rate less than about 3°C per minute; and D. thereafter cooling the semiconductor body from said temperature to below about 300°C at a rate greater than about 25°C per minute.

26. The method of making a semiconductor device as set forth in claim 25 wherein:

in Step B, the heating of the diffusion furnace is to a temperature higher than about 1,100°C.

27. A method of making a semiconductor device as set forth in claim 25 wherein:

the organic film carries aluminum oxide and at least one other P-type impurity diffusion material; and comprising the additional step between the heating and slow cooling steps:

additionally heating the semiconductor body in a diffusion furnace to a temperature of at least about 1,250°C, while maintaining a nitrogen atmosphere in the diffusion furnace, to drive the P-type impurities into the semiconductor body and diffuse aluminum into P-type impurity regions of the semiconductor body.

28. A method of making a semiconductor device as set forth in claim 26 wherein:

in Step C, the slow cooling is carried to a temperature between about 575° and 675°C.

29. A method of making a semiconductor device utilizing Czochralski silicon comprising the steps of:

A. placing at least one doped semiconductor body of Czochralski silicon in a diffusion furnace;

B. heating the diffusion furnace to a temperature higher than about 1,000°C and diffusing an impurity into the semiconductor body to form a PN junction therein;

C. cooling the semiconductor body to a temperature between 550° and 800°C at a rate less than about 3°C per minute; and D. thereafter cooling the semiconductor body from said temperature to below about 300°C at a rate greater than about 25°C per minute.

30. A method of making a semiconductor device utilizing Czochralski silicon as set forth in claim 29 wherein:

in Step B, the heating of the diffusion furnace is to a temperature higher than about 1,100°C.

31. A method of making a semiconductor device utilizing Czochralski silicon as set forth in claim 29 wherein:

in Step C, the slow cooling is at a rate less than about 2°C per minute.

32. A method of making a semiconductor device utilizing Czochralski silicon as set forth in claim 29 wherein:

in Step C, the slow cooling is to a temperature between about 575° and 675°C.

* * * * *